(12) United States Patent
Wright

(10) Patent No.: US 11,881,833 B2
(45) Date of Patent: *Jan. 23, 2024

(54) RADIO FREQUENCY FILTERING CIRCUITRY ON INTEGRATED PASSIVE DIE

(71) Applicant: Qorvo US, Inc., Greensboro, NC (US)

(72) Inventor: Peter V. Wright, Portland, OR (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/968,292

(22) Filed: Oct. 18, 2022

(65) Prior Publication Data

US 2023/0058725 A1 Feb. 23, 2023

Related U.S. Application Data

(63) Continuation of application No. 17/079,240, filed on Oct. 23, 2020, now Pat. No. 11,489,506.

(60) Provisional application No. 62/925,477, filed on Oct. 24, 2019.

(51) Int. Cl.
*H03H 7/01* (2006.01)
*H03H 1/00* (2006.01)

(52) U.S. Cl.
CPC ......... *H03H 7/0115* (2013.01); *H03H 7/175* (2013.01); *H03H 7/1766* (2013.01); *H03H 7/1775* (2013.01); *H03H 2001/0078* (2013.01); *H03H 2001/0085* (2013.01)

(58) Field of Classification Search
CPC ......... H03H 7/0115; H03H 2001/0085; H03H 7/1766; H03H 7/1775; H03H 7/175

USPC .................................................. 333/175, 185
See application file for complete search history.

(56) References Cited

U.S. PATENT DOCUMENTS

| 11,489,506 | B2 * | 11/2022 | Wright | H03H 7/1766 |
| 2010/0265010 | A1 | 10/2010 | Jian | |
| 2019/0200454 | A1 | 6/2019 | Liu et al. | |
| 2021/0126607 | A1 | 4/2021 | Wright | |

OTHER PUBLICATIONS

Lee, Y. et al., "High Rejection Low-Pass-Filter Design Using Integrated Passive Device Technology for Chip-Scale Module Package," 2010 Proceedings 60th Electronic Components and Technology Conference (ECTC), Jun. 1-4, 2010, Las Vegas, NV, USA, IEEE, pp. 2025-2030.

(Continued)

*Primary Examiner* — Rakesh B Patel
(74) *Attorney, Agent, or Firm* — Withrow & Terranova, P.L.L.C.

(57) ABSTRACT

An integrated passive die includes a substrate, an input node, an output node, and RF filtering circuitry. The RF filtering circuitry includes a number of LC tank circuits coupled between the input node and the output node. Each one of the LC tank circuits include an inductor and a capacitor. The inductor is formed by a metal trace over the substrate. The capacitor is coupled in parallel with the inductor over the substrate. The inductor and the capacitor are provided such that a resonance frequency of the combination of the inductor and the capacitor is less than a self-resonance frequency of the inductor.

17 Claims, 9 Drawing Sheets

(56) References Cited

OTHER PUBLICATIONS

Liu, L. et al., "Compact Harmonic Filter Design and Fabrication Using IPD Technology," IEEE Transactions on Components and Packaging Technologies, vol. 30, No. 4, Dec. 2007, IEEE, pp. 556-562.
Non-Final Office Action for U.S. Appl. No. 17/079,240, dated May 12, 2022, 6 pages.

* cited by examiner

RADIO FREQUENCY FILTERING CIRCUITRY ON INTEGRATED PASSIVE DIE

CROSS-REFERENCE TO RELATED APPLICATIONS(S)

This application is a continuation of U.S. patent application Ser. No. 17/079,240 filed on Oct. 23, 2020, now U.S. Pat. No. 11,489,506, which claims priority to U.S. Provisional Patent Application No. 62/925,477 filed on Oct. 24, 2019, wherein the entire contents of the foregoing applications are hereby incorporated by reference herein.

FIELD OF THE DISCLOSURE

The present disclosure is related to radio frequency (RF) filtering circuitry, and in particular to RF filtering circuitry provided in an integrated passive die (IPD).

BACKGROUND

Radio frequency (RF) filtering circuitry is a crucial component in modern wireless communications devices. As wireless communications technologies continue to evolve, the requirements on the performance of RF filtering circuitry continue to become more stringent. For example, RF filtering circuitry must provide low insertion loss, high quality factor, and a small footprint. Conventional RF filtering circuitry often provides adequate performance in one of these categories at the expense of another. For example, conventional RF filtering circuitry may provide a high quality factor at the expense of a large footprint. Accordingly, there is a need for RF filtering circuitry with an improved relationship between insertion loss, quality factor, and footprint.

SUMMARY

In one embodiment, an integrated passive die includes a substrate, an input node, an output node, and radio frequency (RF) filtering circuitry. The RF filtering circuitry includes a number of LC tank circuits coupled between the input node and the output node. Each one of the LC tank circuits include an inductor and a capacitor. The inductor is formed by a metal trace over the substrate. The capacitor is coupled in parallel with the inductor over the substrate. The inductor and the capacitor are provided such that a resonance frequency of the combination of the inductor and the capacitor is less than a self-resonance frequency of the inductor. By providing the RF filtering circuitry as a number of LC tank circuits and by designing each one of the LC tank circuits so that a resonant frequency thereof is less than a self-resonant frequency of the inductor therein, a capacitance of the inductor may be absorbed into the LC tank circuit such that an apparent quality factor of the inductor is improved. Accordingly, the performance of the RF filtering circuitry may be improved.

In one embodiment, the substrate of the integrated passive die is divided into a first portion and a second portion across a horizontal axis. A location of each one of the LC tank circuits is alternated between the first portion and the second portion of the substrate based on the order in which they are coupled between the input node and the output node. Arranging the LC tank circuits in this manner simultaneously minimizes the footprint of the integrated passive die and maximizes the distance between the input node and the output node.

In one embodiment, the metal trace of the inductor for at least one of the LC tank circuits forms a loop between a first inductor node and a second inductor node. The capacitor for the at least one of the LC tank circuits is coupled across a gap between the first inductor node and the second inductor node such that the capacitor and the metal trace form a closed loop. Providing at least one of the LC tank circuits in this way may minimize a resistance of the LC tank circuit and thereby improve the quality factor thereof.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
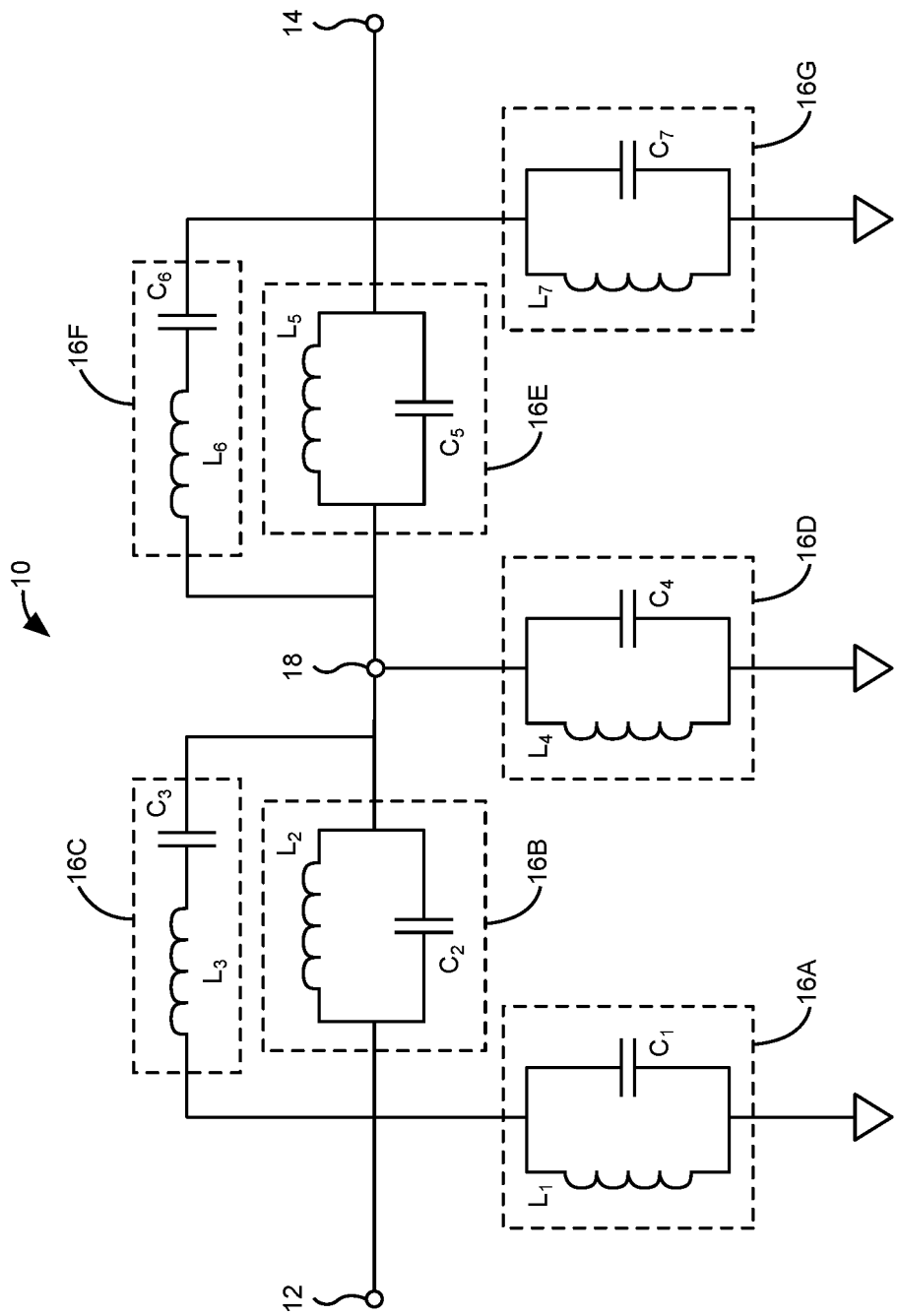
FIG. 1 is a functional schematic of radio frequency (RF) filtering circuitry according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows radio frequency (RF) filtering circuitry 10 according to one embodiment of the present disclosure. The RF filtering circuitry 10 includes an input node 12, an output node 14, and a number of LC resonator circuits 16 coupled between the input node 12 and the output node 14. In particular, a first LC resonator circuit 16A is coupled in a shunt configuration between the input node 12 and ground. The first LC resonator circuit 16A is a LC tank circuit including a first inductor $L_1$ coupled in parallel with a first capacitor $C_1$. A second LC resonator circuit 16B is coupled between the input node 12 and an intermediate node 18. The second LC resonator circuit 16B is an LC tank circuit including a second inductor $L_2$ coupled in parallel with a second capacitor $C_2$. A third LC resonator circuit 16C is coupled between the input node 12 and the intermediate node 18. The third LC resonator circuit 16C is an LC series circuit including a third inductor $L_3$ coupled in series with a third capacitor $C_3$. A fourth LC resonator circuit 16D is coupled between the intermediate node 18 and ground. The fourth LC resonator circuit 16D is an LC tank circuit including a fourth inductor $L_4$ coupled in parallel with a fourth capacitor $C_4$. A fifth LC resonator circuit 16E is coupled between the intermediate node 18 and the output node 14. The fifth LC resonator circuit 16E is an LC tank circuit including a fifth inductor $L_5$ coupled in parallel with a fifth capacitor $C_5$. A sixth LC resonator circuit 16F is coupled between the intermediate node 18 and the output node 14. The sixth LC resonator circuit 16F is an LC series circuit including a sixth inductor $L_6$ coupled in series with a sixth capacitor $C_6$. A seventh LC resonator circuit 16G is coupled between the output node 14 and ground. The seventh LC resonator circuit 16G is an LC tank circuit including a seventh inductor $L_7$ coupled in parallel with a seventh capacitor $C_7$.

In operation, values for the inductors and capacitors are chosen to provide desired resonance frequencies for each one of the LC resonator circuits 16. Signals provided at the input node 12 are then either shunted to ground or passed to the output node 14 depending on their frequency, thus providing a desired frequency response. In the exemplary RF filtering circuitry 10 shown in FIG. 1, a bandpass response is provided. However, the principles of the present disclosure apply equally to filters having any type of response.

Figure 2:
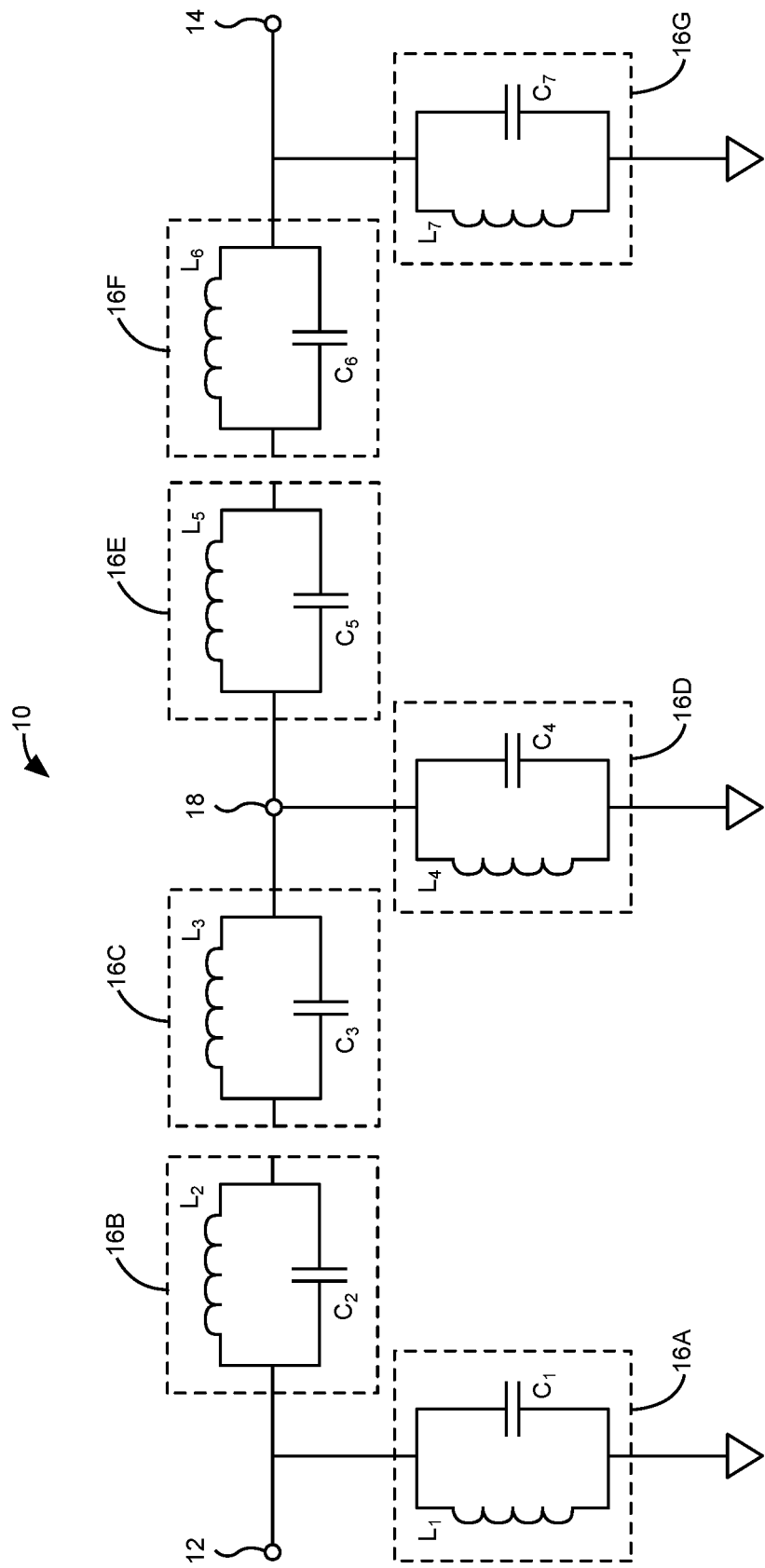
FIG. 2 is a functional schematic of RF filtering circuitry according to one embodiment of the present disclosure.

FIG. 2 shows the RF filtering circuitry 10 according to an additional embodiment of the present disclosure. The RF filtering circuitry 10 shown in FIG. 2 is substantially similar to that shown in FIG. 1, except that the third LC resonator circuit 16C and the sixth LC resonator circuit 16F have been converted from series LC circuits to tank LC circuits and provided in series with the second LC resonator circuit 16B and the fifth LC resonator circuit 16E, respectively, rather than in parallel with the same as shown in FIG. 1. By changing the resonant frequencies of the second LC resonator circuit 16B, the third LC resonator circuit 16C, the fifth LC resonator circuit 16E, and the sixth LC resonator circuit 16F, the RF filtering circuitry 10 shown in FIG. 2 can be functionally equivalent to that shown in FIG. 1. FIG. 2 demonstrates that any ladder filter can be provided as a number of LC tank circuits such that no LC series circuits are necessary. This is important for the reasons discussed below.

Figure 3:
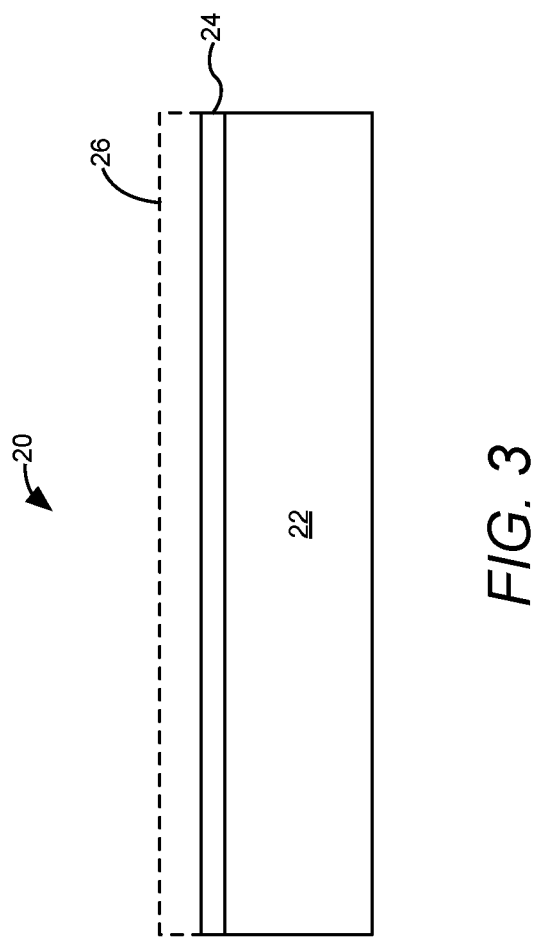
FIG. 3 is a cross-sectional view of an integrated passive die according to one embodiment of the present disclosure.

FIG. 3 shows a cross-sectional view of an integrated passive die 20 according to one embodiment of the present disclosure. The integrated passive die 20 includes a substrate 22, an insulating layer 24 on the substrate 22, and a component area 26 on the insulating layer 24. The substrate 22 may be a semiconductor or insulating material such as silicon, sapphire, glass, or the like. The insulating layer 24 may be any suitable insulator such as $Al_2O_3$. While not shown, one or more components such as inductors, capacitors, resistors, and the like, may be formed on the insulating layer 24 in the component area 26 as integrated passive devices (IPDs) using well-known fabrication techniques for semiconductor devices. Using semiconductor fabrication techniques to provide components such as inductors, capacitors, and resistors allows the critical dimensions of these components to be much smaller than is achievable using conventional fabrication techniques for these components such as those used for laminate.

Figure 4:
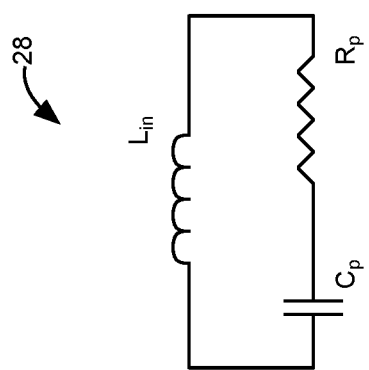
FIG. 4 is a functional schematic of an equivalent circuit for an inductor according to one embodiment of the present disclosure.

FIG. 4 shows an equivalent circuit 28 for an inductor according to one embodiment of the present disclosure. The equivalent circuit 28 includes an internal inductance $L_{in}$, a parasitic capacitance $C_p$, and a parasitic resistance $R_p$. At a frequency determined by the internal inductance $L_{in}$ and the parasitic capacitance $C_p$, the inductor represented by the equivalent circuit 28 will become self-resonant. As this self-resonance frequency is approached the apparent inductance value of the equivalent circuit 28 increases. At self-resonance, there are increased self-contained circulating currents between the internal inductance $L_{in}$ and the parasitic capacitance $C_p$. Some of these internal circulating currents are dissipated in the parasitic resistance $R_p$ such that the quality factor of the inductor represented by the equivalent circuit 28 is degraded.

Figure 5:
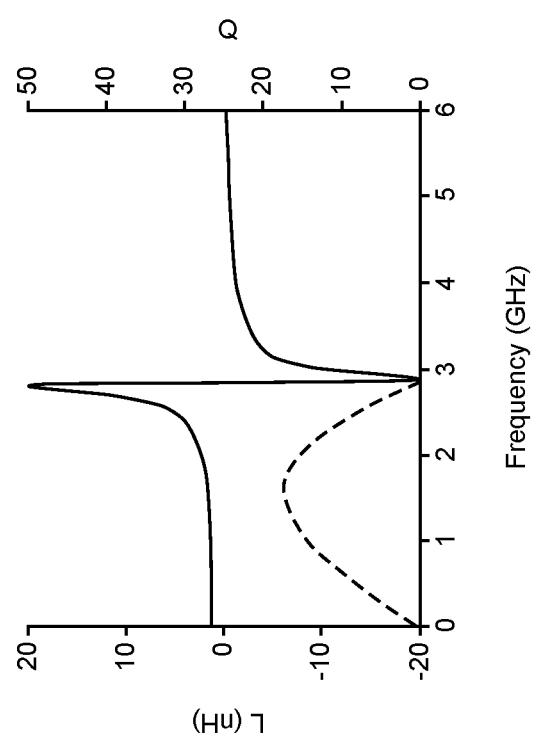
FIG. 5 is a graph illustrating the performance of an LC tank circuit according to one embodiment of the present disclosure.

FIG. 5 is a graph illustrating an apparent inductance and quality factor of an exemplary LC tank circuit. A solid line in FIG. 5 shows the apparent inductance of the exemplary LC tank circuit. A dashed line in FIG. 5 shows the quality factor of the exemplary LC tank circuit. The results shown are for an inductor L with an inherent quality factor $$Q_L = \frac{\omega L}{R_L} = 60$$

and a capacitor C with an inherent quality factor $$Q_C = \frac{1}{\omega C R_C} = 150.$$

As shown, despite having an inherent quality factor of 60 (and the capacitor even higher), the apparent quality factor of the LC tank circuit peaks around 18. Mathematically, it can be shown that the inherent inductor quality factor $$Q_L = \frac{\omega_r L}{R_L} \approx \frac{3\sqrt{3} Q_{max}}{2} \approx 2.6 Q_{max}$$

where $\omega_r$ is the resonant angular frequency of the LC tank circuit, and $$\omega_{max} \approx \frac{\omega_r}{\sqrt{3}} \approx 0.577 \omega_r.$$

FIGS. 4 and 5 and the discussion thereof illustrate that the actual quality factor of a resonant circuit can be far lower than the inherent quality factor of its constituent components. The effects discussed above have been especially problematic for inductors fabricated on integrated passive die using semiconductor fabrication techniques, since, as discussed above the critical dimensions thereof are much smaller than their conventional counterparts (e.g., on laminate). Due to their smaller critical dimensions, the parasitic capacitance thereof will be significantly higher than a conventional planar inductor due to the smaller gaps between the inductor turns. That is, inductors provided using integrated passive die technology will provide much smaller apparent quality factor than their conventional counterparts, even when a thickness of the metal used for such an integrated passive die inductor is significantly greater than the skin depth.

Figure 6:
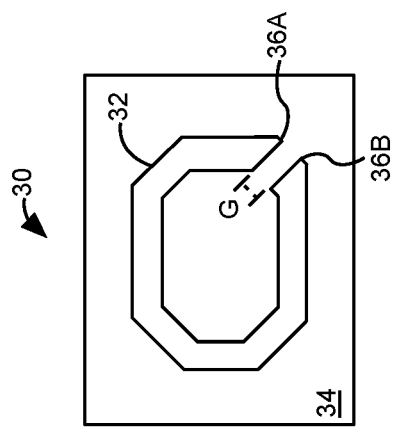
FIG. 6 is a top-down view of an inductor on an integrated passive die according to one embodiment of the present disclosure.

FIG. 6 shows an inductor 30 fabricated using integrated passive die technology according to one embodiment of the present disclosure. The inductor 30 is provided by a metal trace 32 over a substrate 34. The metal trace 32 forms a loop between a first inductor node 36A and a second inductor node 36B. As discussed above, using integrated passive die technology allows the critical dimensions of the inductor L to be very small. In one embodiment, a gap G between the first inductor node 36A and the second inductor node 36B is less than 1 cm. In various embodiments, the gap G between the first inductor node 36A and the second inductor node 36B may be less than 0.75 cm, less than 0.5 cm, less than 1 mm, less than 0.5 mm, less than 0.25 mm, and as small as 0.1 mm. While not shown, a capacitor is provided across the gap between the first inductor node 36A and the second inductor node 36B such that the metal trace 32 and the capacitor form a closed loop. The capacitor may be a soldered-on surface mount component, or may be provided according to well-known integrated passive die processes. As shown, no portion of the metal trace 32 is used that does not provide a part of the inductor form factor, and thus there are no unnecessary losses provided by the metal trace 32. Providing the inductor 30 in this way allows the resistance of the closed loop formed by the inductor 30 and a capacitor coupled across the gap between the first inductor node 36A and the second inductor node 36B to be minimized, thereby decreasing the losses discussed above due to circulating currents therein. Accordingly, an apparent quality factor of an LC tank circuit formed by the inductor 30 may be significantly improved.

Figure 7:
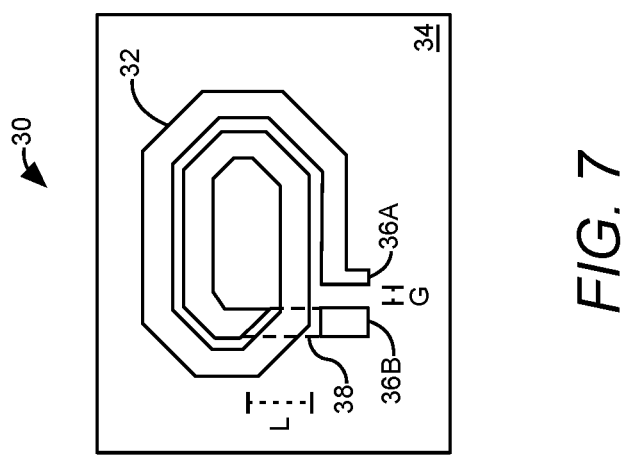
FIG. 7 is a top-down view of an inductor on an integrated passive die according to one embodiment of the present disclosure.

FIG. 7 shows the inductor 30 fabricated using integrated passive die technology according to an additional embodiment of the present disclosure. The inductor 30 shown in FIG. 7 is substantially similar to that shown in FIG. 6 except that the metal trace 32 is provided over the substrate 34 as a spiral instead of a loop. The metal trace 32 provides at least one nested spiral such that within an outer perimeter of the metal trace 32 a number of parallel lines form the spiral. Because the metal trace 32 provides a nested spiral, a buried trace 38 is required to couple a termination of the metal trace 32 at the inside of the spiral to the second inductor node 36B. The buried trace 38 does not form part of the inductor form factor, and thus may contribute unnecessarily to resistive losses due to circulating currents between the inductor 30 and a capacitor coupled across the gap between the first inductor node 36A and the second inductor node 36B. However, a length L of the buried trace 38 is minimized, such that a length of the buried trace is less than 1 cm in one embodiment. In other embodiments, the length L of the buried trace 38 may be less than 0.75 cm, less than 0.5 cm, less than 1 mm, less than 0.5 mm, less than 0.25 mm, and as small as 0.1 mm. This is significantly less than the traces often used in conventional circuitry for coupling inductors to capacitors. Providing the inductor 38 in this way allows the resistance of the closed loop formed by the inductor 30 and a capacitor coupled across the gap between the first inductor node 36A and the second inductor node 36B to be minimized, thereby decreasing the losses discussed above due to circulating currents therein. Accordingly, an apparent quality factor of an LC tank circuit formed by the inductor 30 may be significantly improved.

Figure 8:
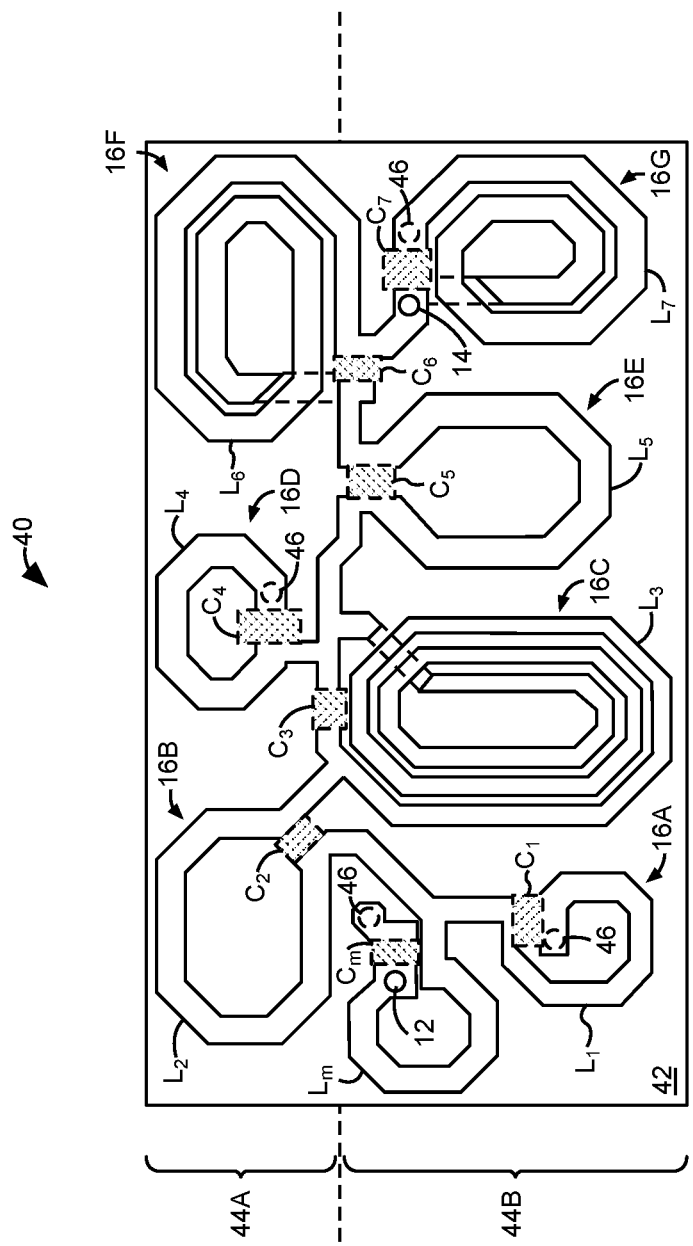
FIG. 8 is a top-down view of RF filtering circuitry on an integrated passive die according to one embodiment of the present disclosure.

FIG. 8 shows a top-down view of an integrated passive die 40 according to one embodiment of the present disclosure. The integrated passive die 40 is an implementation of the RF filtering circuitry 10 discussed above with respect to FIG. 2. The integrated passive die 40 includes a substrate 42 on which the LC resonator circuits 16 are provided. As discussed above, each one of the LC resonator circuits 16 includes an inductor L and a capacitor C. Each one of the LC resonator circuits 16 is an LC tank circuit that is fabricated as discussed above with respect to FIGS. 6 and 7. An additional matching inductor $L_m$ and an additional matching capacitor $C_m$ are also provided on the integrated passive die 40. A dashed line across a horizontal axis divides the substrate into a first portion 44A and a second portion 44B. Notably, the LC resonator circuits 16 alternate in position between the first portion 44A and the second portion 44B based on the order in which they are coupled between the input node 12 and the output node 14. Specifically, the first LC resonator circuit 16A is coupled between the input node 12 and the output node 14 first (moving left to right in the schematic shown in FIG. 2), and is provided over the second portion 44B of the substrate 42. The second LC resonator circuit 16B is coupled between the input node 12 and the output node 14 second, and is provided over the first portion 44A of the substrate 42. The pattern continues in this manner. A number of vias 46 are shown for connecting various ones of the inductors to ground to form a shunt LC tank circuit. Another way to describe the layout of the integrated passive die 40 is that adjacent ones of the LC resonator circuits 16 as they are coupled between the input node 12 and the output node 14 as shown in the schematic are provided on different ones of the first portion 44A and the second portion 44B of the substrate 42. Providing the LC resonator circuits 16 in this manner minimizes a total footprint of the integrated passive die 40 while simultaneously maximizing a distance between the input node 12 and the output node 14. In one embodiment, a total area of the integrated passive die 40 is less than 50 $cm^2$. In other embodiments, a total area of the integrated passive die 40 may be less than 40 $cm^2$, less than 30 $cm^2$, less than 20 $cm^2$, less than 10 $cm^2$, less than 5 $cm^2$, and as small as 1 $cm^2$.

Figure 9:
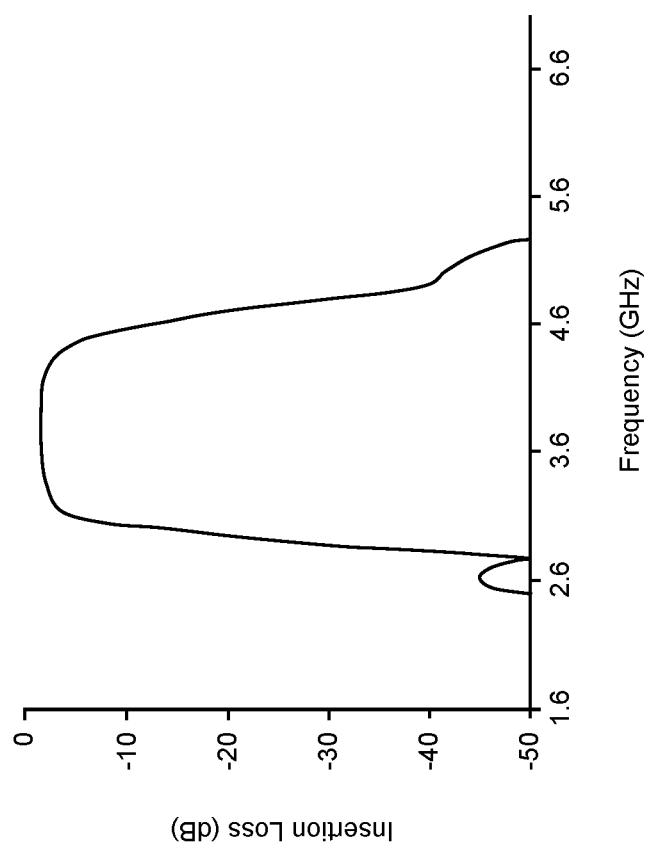
FIG. 9 is a graph illustrating the performance of RF filtering circuitry according to one embodiment of the present disclosure.

FIG. 9 is a graph illustrating an exemplary filter response of the RF filtering circuitry 10 on the integrated passive die 40 according to one embodiment of the present disclosure. As shown, the RF filtering circuitry 10 provides a bandpass response. Notably, an insertion loss of the RF filtering circuitry 10 within the passband is less than 10 dB. In various embodiments, the insertion loss of the RF filtering circuitry 10 within the passband may be less than 7.5 dB, less than 5 dB, less than 2.5 dB, and less than 2 dB. A quality factor of the RF filtering circuitry 10 may remain high. As discussed above, this may be achieved for a total area of the integrated passive die 40 less than 50 $cm^2$ or less. Accordingly, the RF filtering circuitry 10 strikes a better balance between insertion loss, quality factor, and footprint than previous solutions.

Those skilled in the art will recognize improvements and modifications to the preferred embodiments of the present disclosure. All such improvements and modifications are considered within the scope of the concepts disclosed herein and the claims that follow.

What is claimed is:

1. An integrated passive die comprising:
   a substrate;
   an input node and an output node; and
   radio frequency (RF) filtering circuitry comprising a plurality of LC tank circuits coupled between the input node and the output node, each one of the plurality of LC tank circuits comprising:
      an inductor comprising a metal trace over the substrate; and
      a capacitor coupled in parallel with the inductor over the substrate, wherein a resonance frequency of the combination of the inductor and the capacitor is less than a self-resonance frequency of the inductor;
   wherein for at least one of the plurality of LC tank circuits:
      the metal trace of the inductor forms a loop between a first inductor node and a second inductor node; and
      the capacitor is coupled across a gap of less than 0.5 cm between the first inductor node and the second inductor node such that the capacitor and the metal trace form a closed loop.

2. The integrated passive die of claim 1 wherein:
   the substrate is divided into a first portion and a second portion across a horizontal axis; and
   a location of each one of the plurality of LC tank circuits is alternated between the first portion and the second portion of the substrate based on the order in which they are coupled between the input node and the output node.

3. The integrated passive die of claim 1 wherein an insertion loss of the RF filtering circuitry is less than 5 dB.

4. The integrated passive die of claim 1 wherein the integrated passive die comprises at least seven LC tank circuits.

5. The integrated passive die of claim 1 wherein for the at least one of the plurality of LC tank circuits the gap is less than 1 mm.

6. The integrated passive die of claim 1 wherein the substrate is one of silicon, sapphire, and glass.

7. The integrated passive die of claim 1 wherein for at least one of the plurality of LC tank circuits the inductor is an integrated passive device.

8. The integrated passive die of claim 1 wherein for each one of the plurality of LC tank circuits the inductor is an integrated passive device.

9. An integrated passive die comprising:
   a substrate;
   an input node and an output node; and
   radio frequency (RF) filtering circuitry comprising a plurality of LC tank circuits coupled between the input node and the output node, each one of the plurality of LC tank circuits comprising:
      an inductor comprising a metal trace over the substrate; and
      a capacitor coupled in parallel with the inductor over the substrate, wherein a resonance frequency of the combination of the inductor and the capacitor is less than a self-resonance frequency of the inductor;
   wherein for at least one of the plurality of LC tank circuits:
      the metal trace of the inductor forms at least one nested spiral between a first inductor node and a second inductor node; and
      a buried trace is provided between a termination of the metal trace at an inside of the spiral to the second inductor node; and
   wherein the integrated passive die comprises at least one of the following features (i) to (iii):
      (i) a length of the buried trace is less than 1 cm;
      (ii) the substrate is divided into a first portion and a second portion across a horizontal axis, and a location of each one of the plurality of LC tank circuits is alternated between the first portion and the second portion of the substrate based on the order in which they are coupled between the input node and the output node; and
      (iii) an insertion loss of the RF filtering circuitry is less than 5 dB.

10. The integrated passive die of claim 9, comprising feature (i), namely, wherein a length of the buried trace is less than 1 cm.

11. The integrated passive die of claim 10, wherein the length of the buried trace is less than 0.5 cm.

12. The integrated passive die of claim 9, comprising feature (ii), namely, wherein:
- the substrate is divided into a first portion and a second portion across a horizontal axis; and
- a location of each one of the plurality of LC tank circuits is alternated between the first portion and the second portion of the substrate based on the order in which they are coupled between the input node and the output node.

13. The integrated passive die of claim 9, comprising feature (iii), namely, wherein an insertion loss of the RF filtering circuitry is less than 5 dB.

14. The integrated passive die of claim 13 wherein the integrated passive die comprises at least seven LC tank circuits.

15. The integrated passive die of claim 9 wherein the substrate is one of silicon, sapphire, and glass.

16. The integrated passive die of claim 9 wherein for at least one of the plurality of LC tank circuits the inductor is an integrated passive device.

17. The integrated passive die of claim 9 wherein for each one of the plurality of LC tank circuits the inductor is an integrated passive device.

* * * * *